United States Patent [19]

Arques

[11] Patent Number: 4,758,741
[45] Date of Patent: Jul. 19, 1988

[54] PHOTOSENSITIVE DEVICE ENSURING AN ANTI-BLOOMING EFFECT
[75] Inventor: Marc Arques, Paris, France
[73] Assignee: Thomson-CSF, Paris, France
[21] Appl. No.: 42,579
[22] Filed: Apr. 13, 1987
[30] Foreign Application Priority Data
  Jun. 25, 1982 [FR] France .................. 82 11205
[51] Int. Cl.[4] .............. H03K 3/42; H01L 29/78; H01L 27/14; H01L 31/00
[52] U.S. Cl. ......................... 307/311; 357/24; 357/30
[58] Field of Search ............. 357/24 LR, 30; 307/311
[56] References Cited
  U.S. PATENT DOCUMENTS
  3,849,651 11/1974 Ennulat .................... 357/24 LR
  4,093,872 6/1978 Hartman et al. .............. 357/30
  4,100,672 7/1978 King et al. ............... 357/24 LR OTHER PUBLICATIONS
International Conference on Charge Coupled Devices, 29–31 octobre 1975, Edinburgh (GB); A. J. Steckl: "Injection Efficiency in Hybrid IRCCD's", pp. 85–91.
IEEE Transactions on Electron Devices, vol. ED-27, No. 1, janvier 1980, New York (US), P. Felix et al.: "CCD Readout of Infrared Hybrid Focal-Plane Arrays", pp. 175–188.

Primary Examiner—Gene M. Munson
Attorney, Agent, or Firm—Roland Plottel

[57] ABSTRACT

Each integration cell is surrounded by means imposing, at least during the charge integration time, a given surface potential. The detectors and integration cells are integrated onto semiconductor substrates receiving different biasing voltages and such that in the case of overillumination, each detector is biased at its open circuit voltage and supplies no further current until the surface potential of the integration cell has reached the given surface potential, which produces an anti-blooming effect.

13 Claims, 3 Drawing Sheets

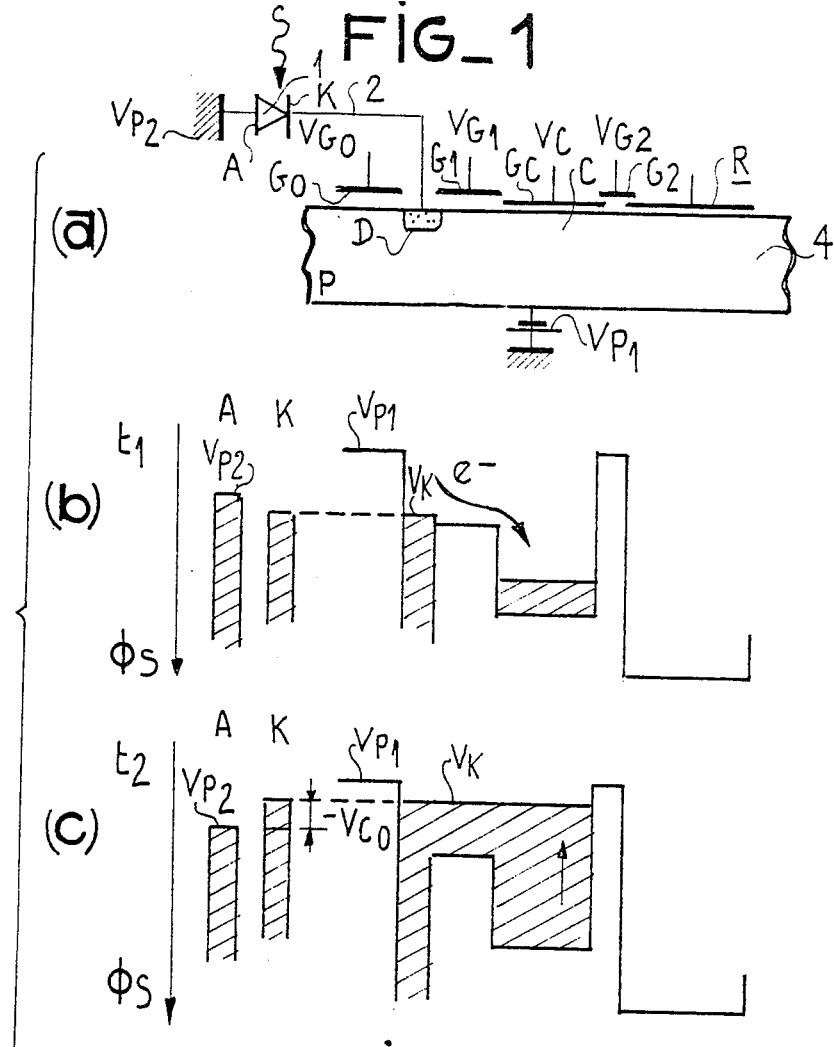
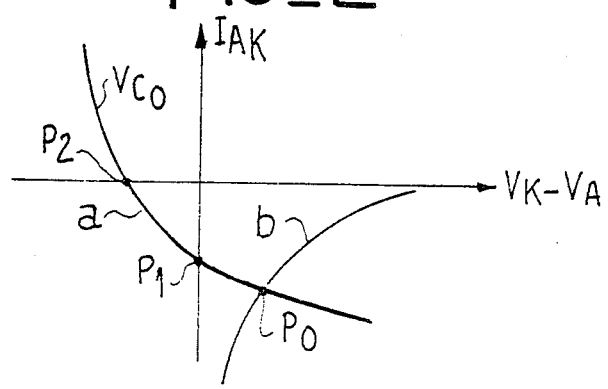

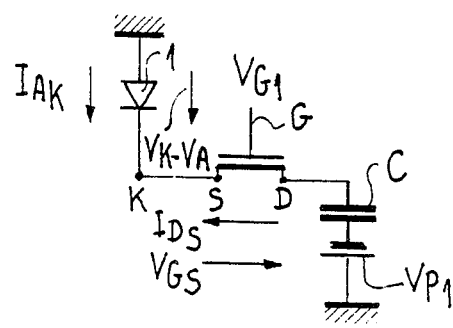
FIG_3
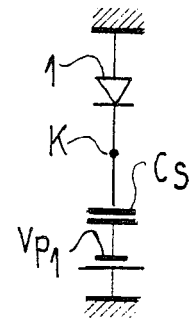
FIG_4
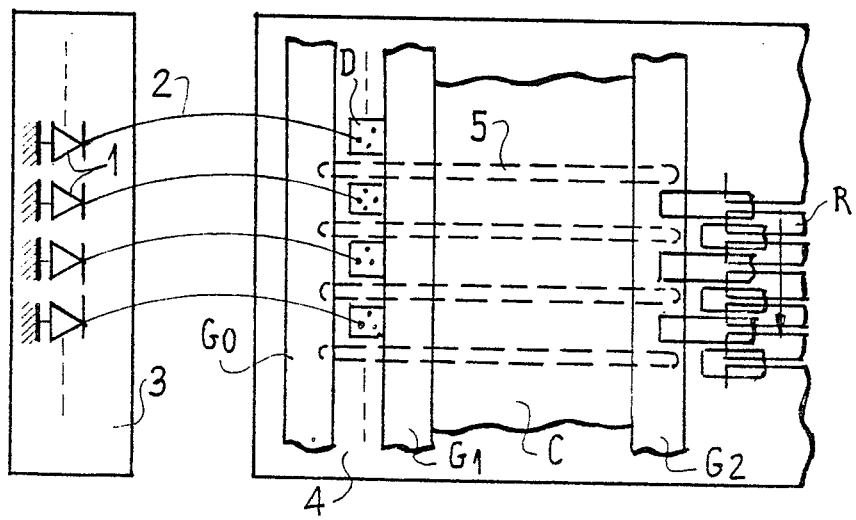
FIG_5
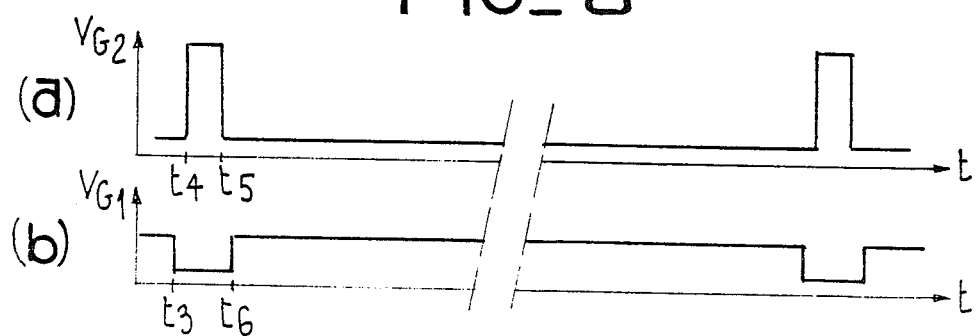
FIG_8

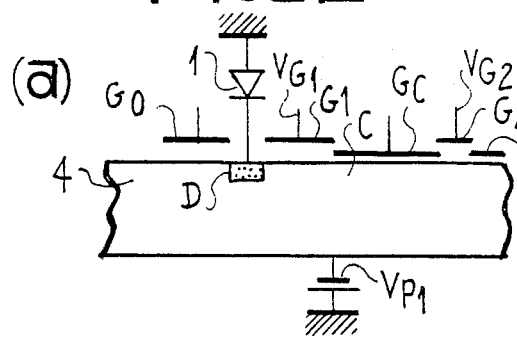
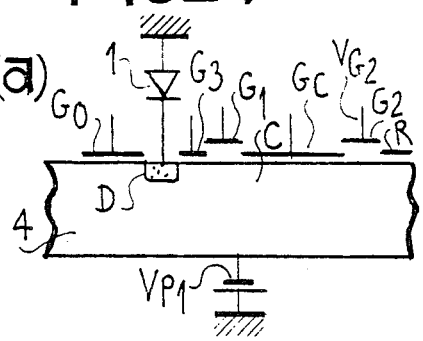
FIG_6     FIG_7
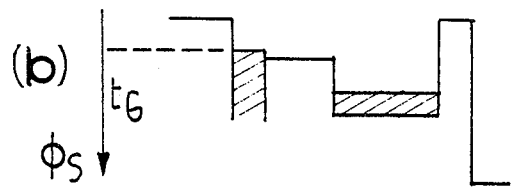
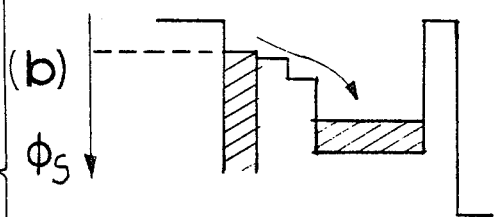
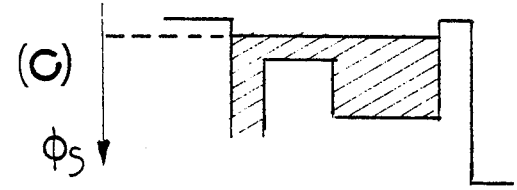
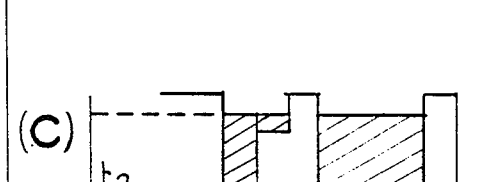
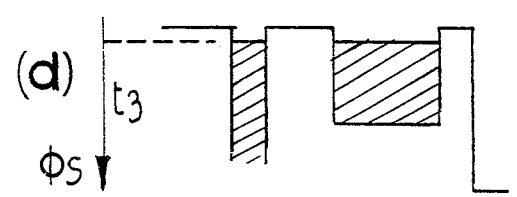
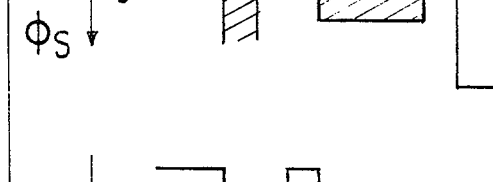
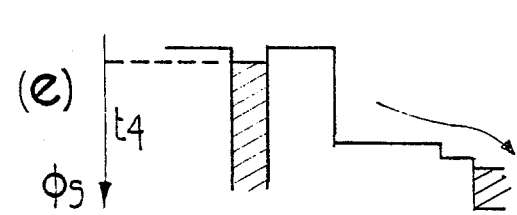
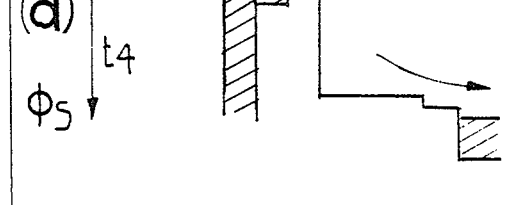
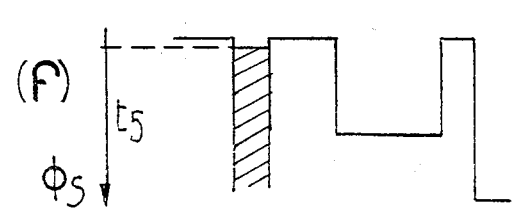
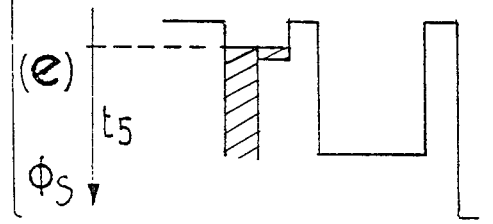

PHOTOSENSITIVE DEVICE ENSURING AN ANTI-BLOOMING EFFECT

This is a continuation of co-pending application Ser. No. 505,751, filed on June 20, 1983, now abandoned.

The present invention relates to a photosensitive device ensuring an anti-blooming effect. The invention relates to the field of photosensitive devices integrated onto a semiconductor substrate.

One of the disadvantages of these devices is their poor resistance to blooming. When one point of the device is too intensely illuminated, the charges injected at this point can be distributed throughout the device, so that there is a loss of part of the image corresponding to the presence of unwanted charges.

In order to eliminate this disadvantage, it is known to use anti-blooming devices, which absorb the excess charges. The read signal of the overilluminated points is clipped, but the remainder of the photosensitive device is not disturbed. In the prior art, the addition of an anti-blooming device to a photosensitive device significantly complicated the basic construction of the latter.

SUMMARY OF THE INVENTION

The present invention relates to a photosensitive device ensuring an anti-blooming effect and which only involves few modifications to the basic construction of the photosensitive device.

The present invention specifically relates to a photosensitive device ensuring an anti-blooming effect, comprising at least one photosensitive detector, each detector being connected to a charge integration cell, which is itself connected to charge reading means, wherein each integration cell is surrounded by means imposing, at least during the charge integration time, a given surface potential, whilst the detectors and integration cells are integrated onto semiconductor substrates receiving different biasing voltages and such that in the case of overillumination, each detector is biased at its open circuit voltage and does not supply current until the surface potential of the integration cell has reached the given surface potential, which produces an anti-blooming effect.

In order to permit the application of the invention, it is necessary to be able to differently bias the semiconductor substrate carrying the detectors and that carrying the integration cells. This is particularly the case in photosensitive devices for infrared detection, where the detectors and integration cells are integrated onto two different substrates. For example, mercury and cadmium telluride or indium antimonide are used for the infrared detectors, whilst, for example, gallium arsenide or silicon are used for the integration cells and the reading means.

The following description relates to the case of a photosensitive device for infrared detection using two different substrates, but it is obvious that the invention also applies to photosensitive devices for detecting radiation of a random wavelength. When the photosensitive device is integrated in a single chip substrate, it is necessary to be able to differently bias the substrate portion carrying the detectors and the substrate carrying the integration cells, by using e.g. insulating boxes.

It is pointed out that the invention ensured perfect anti-blooming with respect to the integration of the signal. It is impossible to have any overflow of charges from one integration cell to the adjacent cells. In one of its embodiments, the invention also ensures a perfect anti-blooming with respect to the reading means. It is possible to dimension the reading means as a function of the maximum charge quantity, which can be transferred from each integration cell.

BRIEF DESCRIPTION OF THE DRAWINGS

The invention is described in greater detail hereinafter relative to non-limitative embodiments and with reference to the attached drawings, wherein:

FIG. 1a is the diagram of an embodiment of the device according to the invention, whilst FIGS. 1b and 1c are diagrams showing the surface potentials in the substrate onto which is integrated said device at two times $t_1$ and $t_2$.

FIG. 2 is the characteristics of the photodiode and the MOS transistor forming part of the charge integration cell.

FIGS. 3 and 4 are equivalent circuit diagrams to the device of FIG. 1.

FIG. 5 is the diagram, in plan view, of another embodiment of the device according to the invention.

FIGS. 6a to f and 7a to e are, the diagrams of two embodiments of the device according to the invention and the diagrams showing the evolution, as a function of time, of the surface potential in the substrate.

FIGS. 8a and b show, two clock signals applied to the devices according to the invention and shown in FIGS. 6a and 7a.

DETAILED DESCRIPTION OF THE INVENTION

In the various drawings, the same references designate the same elements, but for reasons of clarity, the sizes and proportions of the various elements have not been respected.

FIG. 1a is the diagram of an embodiment of the device according to the invention. In FIG. 1a, the photosensitive detector 1 used is a photodiode. The invention applies no matter what type of infrared detector is used and thus also e.g. when the detector is of the gate-insulation—semiconductor type.

Anode A of photodiode 1 receives a biasing voltage $V_{P2}$. Its cathode K is connected by a connection 2 to a diode D for the integration of the charges produced in photodiode 1 by the radiation to be detected and which is symbolized by a wavy arrow.

As shown in FIG. 5, which is a plan view of an embodiment of the device according to the invention, the photosensitive detectors 1 are integrated onto a first semiconductor substrate 3, which is separate from second substrate 4 onto which are integrated the charge integration cells and the remainder of the photosensitive device. The semiconductor substrate 4 receives a biasing voltage $V_{P1}$.

The invention relates to photosensitive devices incorporating at least one detector 1. It is obvious that the device according to the invention can comprise several detectors 1. These detectors can be aligned, as in FIG. 5, or for example can be arranged in matrix-like manner.

Each charge integration cell comprises a diode D which, in FIG. 1a, is constituted by a zone of type N, produced in semiconductor substrate 4, in silicon of type P. According to FIG. 1a, diode D is connected by a connection 2 to cathode K of a photodiode 1. Electrode or gate $G_1$ separates each diode D from a charge storage capacitor C, constituted by an electrode or gate $G_C$, an insulating layer and the substrate. For reasons of clarity in FIG. 1a, the insulating layer separating the various electrodes from the surface of the semiconductor substrate 4 has not been shown. Electrode or gate $G_2$ separates each capacitor C from the charge reading means, which can be constituted by a charge transfer shift register R having parallel inputs connected to the integration cells and with a series output connected to a not shown amplifier.

It can be seen in FIG. 5 that insulating diffusions 5, of the same type as the substrate, but more highly doped, longitudinally define each charge integration cell. These cells are transversely defined by gate $G_2$ and by a gate $G_0$, positioned in the vicinity of the diode D and separated from gate $G_1$ by diodes D.

Register R functions as a multiplexer. Thus, there is only one ouput connection and only one amplifier is required. It is possible to use a multiplexer not constituted by a charge transfer shift register. In the same way, it is possible to use reading means having the same number of amplifiers as there are detectors.

The device according to the invention will now be investigated.

FIGS. 1b and c show the surface potential in substrates 3 and 4, onto which is integrated the device, at two times $t_1$ and $t_2$. FIGS. 3 and 4 are equivalent diagrams of the device at times $t_1$ and $t_2$.

FIG. 1b shows the situation in the case of normal illumination, or at the start of the integration time, if overillumination exists. Diode D, electrode $G_1$ and the capacitor C of each integration cell farm a MOS transistor T, of which diode D is the source and of which capacitor C is the induced drain.

This MOS transistor is biased in the saturation mode, because the d.c. voltage $V_c$ applied to gate $G_C$ exceeds the d.c. voltage $V_{G1}$ applied to gate $G_1$. The level of the charges on diode D is aligned with the constant potential existing beneath gate $G_1$. The cathode K of the photodiode receives a substantially constant polarization and the charges produced in the detector by the radiation are stored in capacitor C, as shown symbolically in FIG. 1b, where the hatched areas indicate the presence of minority carriers with respect to substrate 4.

The insulation diffusions 5, which longitudinally define the integration cells impose a surface potential substantially equal to the biasing voltage $V_{P1}$ of the substrate 4.

To gate $G_o$ and $G_2$ are applied biasing voltages $V_{Go}$ and $V_{G2}$ such that, for example, the surface potential beneath the gate is substantially equal to the biasing voltage $V_{P1}$ of substrate 4. The biasing voltages are such that the charges can only pass from diode D to capacitor C.

At the left in FIG. 1b, it is possible to see the potentials of the anode and the cathode of photodiode 1. The anode is at fixed potential $V_{P2}$, which has been chosen equal to zero volt, whilst the cathode is at a positive potential imposed by gate $G_1$.

FIG. 3 is the equivalent diagram for the device of FIG. 1a at time $t_1$. The current of photodiode 1, across the MOS transistor T in saturation, charges capacitor C.

FIG. 2 shows as a function of the current passing from the anode to the cathode $I_{AK}$ and the voltage difference between the cathode and the anode $V_K - V_A$, the characteristics of the photodiode a and of the MOS transistor T b. The intersection of these two characteristics give the operating point $P_o$ of the device. The operating point remains at $P_o$ for as long as the storage capacitor C is not filled.

FIG. 1c shows the surface potentials at time $t_2$, when the storage capacitor is saturated. The charges then accumulate not only in the storage capacitor, but also beneath gate $G_1$, on input diffusion D and on the connection 2 between photodiode 1 and diffusion D. The integration cell no longer behaves as a transistor in the saturated mode, but as a capacitor $C_S$, which is the sum of the storage capacitor C, the capacitance existing beneath $G_1$, the capacitance of input diffusion D and the capacitance of connection 2 between the photodiode and the input diffusion. FIG. 4 shows the equivalent diagram of the device at time $t_2$. Photodiode 1 charges capacitor $C_S$.

From the time when the storage capacitor C is saturated and when integration cell no longer behaves as a MOS transistor, the operating point is displaced along characteristic a of the photodiode. It relocates $P_1$, when the biasing voltage $V_K$ of the cathode is equal to that $V_A$ of the anode. If the overillumination continues, the operating point arrives at $P_2$, where it is fixed and where the level of the charges in the integration cell remains unchanged. At $P_2$, the photodiode is biased at its open circuit voltage and supplies no further current $(I_{AK}=0)$. Even if the photodiode continues to be overilluminated, the level of the charges remains fixed in the integration cell.

Thus, a perfect anti-blooming is obtained during the signal integration time. Clipping takes place of the output signal of the overilluminated points, but there can be no overflow of charges from one integration cell to the adjacent cells.

To the left in FIG. 1c, it is possible to see that at time $t_2$, the biasing voltage of the cathode has become lower than that of the anode, which is fixed.

In order that the anti-blooming be effective, it is also necessary for each integration cell to be surrounded by means, which can e.g. be gates or insulation diffusions which, at least during the charge integration time, impose a given surface potential. In addition, it is necessary that the biasing voltages $V_{P1}$ and $V_{P2}$ differ, so that in the case of overillumination, each detector is biased at its open circuit voltage and supplies no further current until the surface potential of the integration cell has reached the given surface potential.

In general, and as in the example of FIG. 1, the given surface potential is chosen substantially equal to the biasing voltage $V_{P1}$ of substrate 4, onto which are integrated the charge integration cells. For example, in the case of FIG. 1, $V_{P2}$ is chosen as 0V and $V_{P1}$ negative and equal e.g. to $-3V$. Thus, the integration cell is limited by zones at a potential of $-3V$, whilst the level of the charges in the cell does not exceed $-V_{co}$, which is the open circuit voltage of the photodiode and is approximately equal to $-10$ to $-50$ mV.

In this case, it would have been possible to apply to $G_0$ and $G_2$ biasing voltages such that these gates impose a surface potential of, for example, $-2V$ or $-1V$ and in all cases slightly below $-50$ mV. The given surface potential is not compulsorily equal to $V_{P1}$.

In a semiconductor substrate, the surface potential which can be obtained is dependent on the biasing voltage and the type of substrate. Thus, in the case of a type P substrate biased at $-3V$, it is impossible to obtain a surface potential below $-3V$. The biasing voltage $V_{P1}$ of the substrate must consequently be chosen whilst taking account of the biasing voltage $V_{P2}$ of the substrate 3 and the open circuit voltage of the detectors. When the given surface potential is chosed substantially equal to the biasing voltage $V_{P1}$ of the substrate 4, it is necessary that the difference between voltages $V_{P1}$ and $V_{P2}$ be at least slightly greater than the absolute value of $V_{C0}$.

The quantity of charges present in the input stage at the end of the integration period is consequently perfectly known and limited to the integration cell. Apart from the biasing voltages of the device, this charge quantity is only dependent on the open circuit voltage of the photodiodes. However, this voltage is little dependent on the illumination of the photodiodes and can be increased without problem.

The problem which now arises is to bring about a perfect anti-blooming relative to the reading means.

To transfer the stored charges from the integration cell to register R, at the end of the integration period, the voltage $V_{G2}$ applied to grid $G_2$ is increased, as shown in FIG. 8a.

The level of the charges in the integration cell decreases and the operating point is displaced from $P_2$ to $P_0$. The photodiode starts to supply current again. The electrons supplied by it traverse the integration cell and are stored in register R. It can then arise that due to the charge quantity supplied by the photodiode during charge transfer to the register, the register is saturated and its operation disturbed. However, it should be noted that the charge transfer time is small compared with the charge integration time.

To prevent this, voltage $V_{G1}$ applied to gate $G_1$ is reduced, in the manner shown in FIG. 8b. This reduction takes place at a time $t_3$ before there is an increase of $V_{G2}$ at time $t_4$.

FIGS. 6d and e show the surface potential in the substrate at times $t_3$ and $t_4$. At time $t_3$, the input diffusion D is insulated by gate $G_1$ from the storage capacitor C. At time $t_4$, gate $G_{G2}$ makes it possible to transfer charges stored by capacitor C to register R. At time $t_5$ in FIG. 6f voltage $V_{G2}$ returns to low level. At time $t_6$ in FIG. 6b, voltage $V_{G1}$ returns to high level and a new charge integration period commences.

The voltage $V_{G1}$ applied to grid $G_1$ from $t_3$ to $t_5$ is such that said grid imposes a constant surface potential, preventing the transfer of charges from diode D to storage capacitor C. This surface potential can be chosen substantially equal to $V_{P1}$.

The dimensions of the shift register are fixed in such a way that it can receive the maximum charge quantity coming from each storage capacitor. In the embodiment of FIG. 6a, this charge quantity is equal to the maximum charge quantity which can be stored by each charge storage capacitor prior to the photodetector being biased at its open circuit voltage.

FIGS. 7a to e show the diagram of an embodiment of the device according to the invention and diagrams showing the evolution of the surface potential in the substrate at various times.

Unlike in the embodiment of FIGS. 1a and 6a, this embodiment has a supplementary gate $G_3$ between the input diffusion D and gate $G_1$. Gate $G_3$ imposes a constant surface potential and ensures the biasing of the cathode of photodiode 1.

Gate $G_3$ is followed by grid $G_1$ which, during the integration period, imposes a constant potential higher than that imposed by $G_3$, so that grid $G_1$ is not involved in the biasing of detector cathode K. From $t_3$ to $t_5$, voltage $V_{G1}$ applied to gate $G_1$ decreases and said grid insulates the input diffusion D from the storage capacitor during the charge transfer time.

Gate $G_3$ makes it possible to more accurately fix the operating point $P_1$ of the nonoverilluminated detectors. Thus, gate $G_3$, which biases the cathode of the detector is permanently at a constant voltage, which is more easy to accurately fix than a square-wave voltage, like that applied to gate $G_1$. Moreover, grid $G_3$ acts as a shield for protecting the input diffusion D against interference produced by the pulses applied to gate $G_1$.

Thus, to bring about a perfect antiblooming at the reading means, it is necessary for each charge integration cell to have means, which on the one hand participate in the polarization of the detector and which on the other hand, at the end of the charge integration time, prevent the transfer of charges coming from diode D.

FIGS. 6a and 7a show two embodiments of the invention, where said means are ocnstituted by grid $G_1$ and by gates $G_3$ and $G_1$.

The preceding description has related to the case of photodiodes having a common anode. However, the invention is also applicable to the case where the photodiodes have a common cathode. In the same way, the substrate 4 on which the integration cells are produced, and optionally the reading means, can either be of type P or type N. When the photodiodes have a common anode, the substrate is of type P. When the photodiodes have a common cathode, the substrate is of type N. The gate $G_o$ can be replaced by an insulation diffusion and insulation diffusions 5 can be replaced by gates.

What is claimed is:

1. A photosensitive device designed for anti-blooming comprising:
   a first substrate portion including at least one photosensitive detector;
   a second substrate portion including a separate integration cell for each detector for receiving charges produced in such detector during a charge integration time, comprising:
   a diode connected to the detector;
   a charge storage capacitor; and
   a first insulated gate located between the diode and the charge storage capacitor;
   means for biasing said first and second substrate portions to different potentials;
   means surrounding each integration cell for isolating said cell from other cells and for imposing a prescribed surface potential around said cell; and
   means including a voltage source for biasing said first insulated gate and said charge storage capacitor with dc voltages sufficient for forming during normal illumination, said diode, said charge storage capacitor and said first insulated gate into a MOS transistor in the saturated mode, and for combining during overillumination when said charge storage capacitor is saturated, said diode, said charge storage capacitor and said first insulated gate to form a capacitor, said detector being then biased to its open circuit voltage and supplying no further charge to the integration cell during overillumination so that the level of charges remains fixed in said cell before reaching the prescribed surface potential.

2. A photosensitive device designed for anti-blooming comprising:
   A first substrate portion including at least one photosensitive detector;
   A second substrate portion including a separate integration cell for each detector for receiving charges produced in such detector during a charge integration time, each integration cell comprising:

a diode connected to the detector;

a charge storage capacitor; and a first insulated gate located between the diode and the charge storage capacitor;

means for biasing said first and second substrate portions to different potentials;

means surrounding each integration cell for isolating said cell from other cells and for imposing a prescribed surface potential around said cell; and means for biasing said first gate and said charge storage capacitor with dc voltages, of magnitudes such that the difference between the potential biasing said first substrate and said prescribed surface potential is at least equal to the open circuit voltage of said detector, and such that during normal illumination, said diode, said charge storage capacitor and said first gate form a MOS transistor in the saturated mode, and during overillumination, when said charge storage capacitor is saturated, said diode, said charge storage capacitor and said first insulated gate combine to form a capacitor, said detector being then biased to its open circuit voltage and supplying no further charge to the integration cell during overillumination, so that the level of charges remains fixed in said cell before reaching the prescribed surface potential.

3. A device according to claim 2, wherein the prescribed surface potential is substantially equal to the biasing potential of the second substrate portion in which is integrated each integration cell.

4. A device according to claim 2, wherein the means surrounding each charge integration cell comprise an insulated gate and insulation diffusions of the same type as the second substrate.

5. A device according to claim 2, wherein the detectors are photodiodes or detectors of the gate-insulator-semiconductor type.

6. A device according to claim 2, wherein the first and second substrate portions are in a common semiconductor chip.

7. A device according to claim 2, wherein the detectors are infrared detectors and the first and second substrates are in separate semiconductive chips.

8. The photosensitive device of claim 2 in which the second substrate portion further includes charge reading means to which the charge on each cell is transferred for parallel read-in and serial read-out.

9. A device according to claim 8, further comprising means for applying different voltages to said first gate during the charge integration time and at the end of the charge integration time and wherein said first insulated gate imposes, during the charge integration time, a first constant surface potential under such gate for participating in the biasing of the detector and, at the end of the charge integration time, and a second constant surface potential under such gate which prevents the transfer to the storage capacitor of charges coming from the diode.

10. A device according to claim 9, wherein the second constant surface potential imposed by the first gate is substantially equal to the biasing potential of the second substrate portion.

11. A device according to claim 8, further comprising a second insulated gate between said diode and said first gate and means for applying appropriate voltages to the first and second gates during the charge integration time and at the end of the charge integration time, and wherein said second gate imposes a constant surface potential under such gate for participating in the biasing of the detector, and said first gate imposes under such first gate, during the charge integration time, a first surface potential permitting the transfer of charges from the diode to the cell, and after the charge integration time, a second surface potential preventing such transfer.

12. A device according to claim 11, wherein the second constant surface potential imposed by the firs gate is substantially equal to the biasing voltage of the second substrate portion.

13. A device according to claim 8, wherein the charge reading means comprise a charge transfer shift register having parallel inputs connected to the integration cells and a serial output.

* * * * *